United States Patent
Cheng et al.

(10) Patent No.: US 9,786,622 B2
(45) Date of Patent: Oct. 10, 2017

(54) SEMICONDUCTOR PACKAGE

(75) Inventors: Ming-Da Cheng, Jhubei (TW);
Chih-Wei Lin, Xinfeng Township (TW); Kuei-Wei Huang, Hsinchu (TW); Yu-Peng Tsai, Taipei (TW); Chun-Cheng Lin, New Taipei (TW); Chung-Shi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 441 days.

(21) Appl. No.: 13/277,575

(22) Filed: Oct. 20, 2011

(65) Prior Publication Data
US 2013/0099370 A1 Apr. 25, 2013

(51) Int. Cl.
*H01L 23/488* (2006.01)
*H01L 23/00* (2006.01)

(52) U.S. Cl.
CPC .............. *H01L 24/16* (2013.01); *H01L 24/13* (2013.01); *H01L 24/81* (2013.01); *H01L 2224/1146* (2013.01); *H01L 2224/11849* (2013.01); *H01L 2224/13005* (2013.01); *H01L 2224/13012* (2013.01); *H01L 2224/13014* (2013.01); *H01L 2224/13082* (2013.01); *H01L 2224/1601* (2013.01); *H01L 2224/16104* (2013.01); *H01L 2224/8191* (2013.01); *H01L 2224/81191* (2013.01); *H01L 2224/81203* (2013.01); *H01L 2224/81815* (2013.01); *H01L 2924/1305* (2013.01); *H01L 2924/1306* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 6,196,443 B1 * | 3/2001 | DiGiacomo | 228/180.22 |
| 6,229,220 B1 * | 5/2001 | Saitoh et al. | 257/780 |
| 6,578,754 B1 * | 6/2003 | Tung | 228/180.22 |
| 6,592,019 B2 * | 7/2003 | Tung | 228/197 |
| 7,382,049 B2 * | 6/2008 | Ho et al. | 257/737 |
| 7,569,935 B1 * | 8/2009 | Fan | 257/737 |
| 7,598,613 B2 * | 10/2009 | Tanida et al. | 257/737 |
| 7,960,270 B2 * | 6/2011 | Lee et al. | 438/612 |
| 8,115,319 B2 * | 2/2012 | Hsu et al. | 257/778 |
| 8,288,871 B1 * | 10/2012 | Shieh et al. | 257/773 |
| 8,546,941 B2 * | 10/2013 | Chen et al. | 257/737 |

(Continued)

FOREIGN PATENT DOCUMENTS

| | | |
|---|---|---|
| CN | 1497710 | 5/2004 |
| KR | 20090011198 | 2/2009 |
| KR | 10-2011-0114912 | 10/2011 |

OTHER PUBLICATIONS

Notice of Allowance dated Jan. 24, 2014 and English translation from corresponding application No. KR 10-2012-0028344.

*Primary Examiner* — Hoang-Quan Ho
(74) *Attorney, Agent, or Firm* — Hauptman Ham, LLP

(57) ABSTRACT

A semiconductor package includes a workpiece with a conductive trace and a chip with a conductive pillar. The chip is attached to the workpiece and a solder joint region is formed between the conductive pillar and the conductive trace. The distance between the conductive pillar and the conductive trace is less than or equal to about 16 μm.

20 Claims, 5 Drawing Sheets

(56) References Cited

U.S. PATENT DOCUMENTS

| | | | |
|---|---|---|---|
| 2004/0058192 A1* | 3/2004 | Kawashima et al. | 428/680 |
| 2006/0216860 A1* | 9/2006 | Pendse | 438/108 |
| 2006/0220259 A1* | 10/2006 | Chen et al. | 257/778 |
| 2006/0283915 A1* | 12/2006 | Rumsey | 228/101 |
| 2007/0045869 A1* | 3/2007 | Ho et al. | 257/780 |
| 2007/0230153 A1* | 10/2007 | Tanida et al. | 361/809 |
| 2008/0213941 A1* | 9/2008 | Pendse | 438/108 |
| 2008/0265411 A1* | 10/2008 | Hu | 257/737 |
| 2009/0146303 A1* | 6/2009 | Kwon | 257/741 |
| 2010/0193944 A1* | 8/2010 | Castro et al. | 257/737 |
| 2010/0193947 A1* | 8/2010 | Pendse | 257/737 |
| 2011/0001250 A1* | 1/2011 | Lin et al. | 257/778 |
| 2011/0186988 A1* | 8/2011 | Chen et al. | 257/737 |
| 2011/0244675 A1* | 10/2011 | Huang et al. | 438/614 |
| 2011/0285013 A1* | 11/2011 | Chuang et al. | 257/737 |
| 2012/0098120 A1* | 4/2012 | Yu et al. | 257/737 |
| 2013/0026619 A1* | 1/2013 | Chang et al. | 257/737 |

\* cited by examiner

SEMICONDUCTOR PACKAGE

BACKGROUND

Integrated circuit chips include semiconductor devices formed on a substrate such as a semiconductor wafer and include metalized contact pads for providing an electrical interface to the integrated circuitry. Bonding bumps are part of the interconnecting structure in an integrated circuitry. A bump provides an interface to an integrated circuit device through which an electrical connection to the device may be made. Techniques for providing a connection between the internal circuitry of a chip and external circuitry, such as a circuit board, another chip, or a wafer, include wire bonding, in which wires are used to connect the chip contact pads to the external circuitry, and can comprise other techniques known in the art. A more recent chip connection technique, known as flip chip technology, provides for connection of integrated circuit devices to external circuitry using solder bumps that have been deposited onto the chip contact pads. In order to mount the chip to external circuitry, the chip is flipped over so that its topside faces down and its contact pads are aligned with matching contact pads on the external circuit. The solder is then reflowed between the flipped chip and the substrate supporting the external circuitry to complete the interconnection. The resulting flip chip package is much smaller than a traditional carrier-based system, because the chip is positioned directly on the external circuitry, such that the interconnect wires may be much shorter. As a result, the inductance and resistive heat are greatly reduced, enabling higher-speed devices.

DETAILED DESCRIPTION

Figure 1:
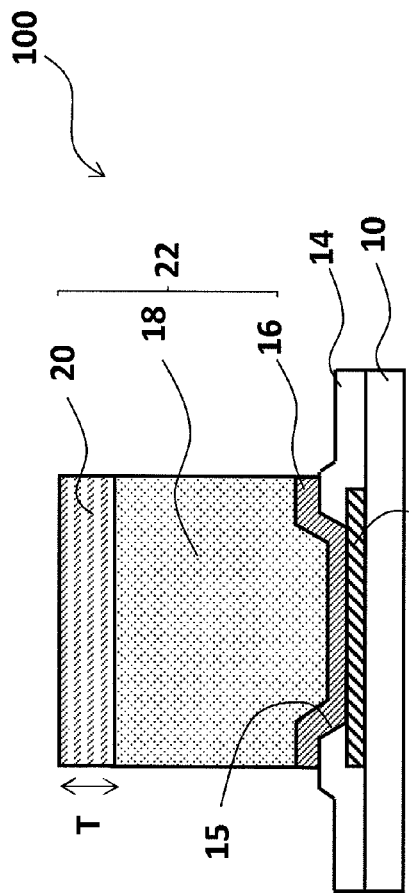
FIG. 1 and FIG. 2 are cross-sectional views of intermediate stages in the manufacturing of a semiconductor device in accordance with some embodiments.

Reference will now be made in detail to exemplary embodiments illustrated in the accompanying drawings. The same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it can be directly on the other layer or on the substrate, or intervening layers can be present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following Figures are not drawn to scale; rather, these Figures are merely intended for illustration.

Figure 2:
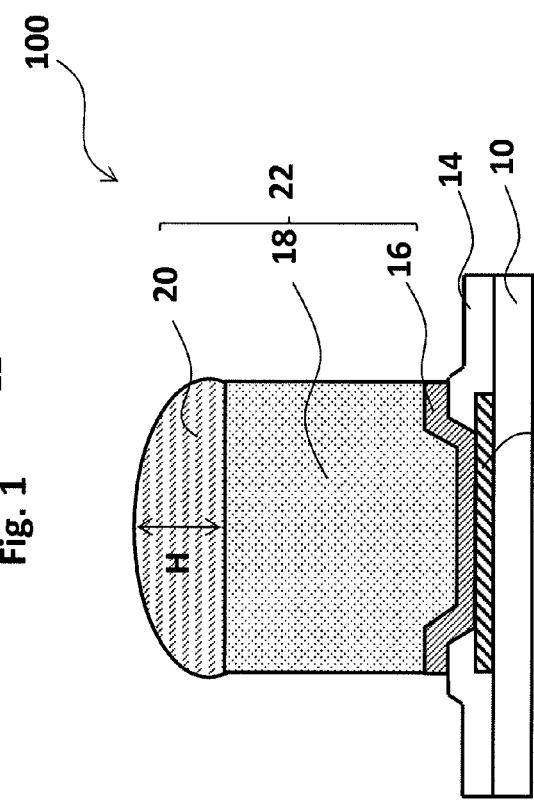

FIGS. 1-2 are cross-sectional views of a portion of a semiconductor device at various stages in an integrated circuit manufacturing process in accordance with an embodiment.

Referring to FIG. 1, a portion of a chip 100 having electrical circuitry formed in and/or upon a substrate 10 is shown. The substrate 10 may be one of a variety of types of semiconductor substrates commonly employed in semiconductor integrated circuit fabrication, and integrated circuits may be formed therein and/or thereupon. The semiconductor substrate may be of any construction comprising semiconductor materials, including but not limited to, bulk silicon, a semiconductor wafer, a silicon-on-insulator (SOI) substrate, or a silicon germanium substrate. Other semiconductor materials, including group III, group IV, and/or group V semiconductors, can be used. Although not shown, it will be recognized that the substrate 10 may further comprise a plurality of isolation features, such as shallow trench isolation (STI) features or local oxidation of silicon (LOCOS) features. The isolation features may isolate various microelectronic elements formed in and/or upon the substrate 10. Examples of the types of microelectronic elements that may be formed in the substrate 10 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other suitable elements. Various processes are performed to form the various microelectronic elements, including but not limited to one or more of deposition, etching, implantation, photolithography, annealing, and other suitable processes. The microelectronic elements are interconnected to form the integrated circuit device, which may comprise one or more of a logic device, memory device (e.g., SRAM), radio frequency (RF) device, input/output (I/O) device, system-on-chip (SoC) device, and other suitable types of devices. The substrate 10 further includes an interconnection structure overlying the integrated circuits. The interconnection structure includes inter-layer dielectric layers and a metallization structure overlying the integrated circuits. The inter-layer dielectric layers in the metallization structure may include one or more of low-k dielectric materials, un-doped silicate glass (USG), silicon nitride (SiN), silicon oxynitride (SiON), and other commonly used materials. The dielectric constants (k value) of the low-k dielectric materials can be less than about 3.9, or less than about 2.8. Metal lines in the metallization structure may be formed of copper or copper alloys.

In an embodiment, conductive pads 12 are formed and patterned in or on a top-level inter-layer dielectric layer, which is a portion of conductive routes. The conductive pads 12 comprise contact pads for providing an electrical connection upon which a bump structure, such as a UBM structure, a solder bump or a copper pillar bump, may be formed for facilitating external electrical connections. The conductive pads 12 can be formed of any suitable conductive materials, including one or more of copper (Cu), tungsten (W), aluminum (Al), AlCu alloys, silver (Al), or similar materials. In some embodiments, the conductive pads 12 can be a region or an end of a redistribution line to provide the desired pin or ball layout. One or more passivation layers, such as a passivation layer 14, are formed and patterned over the conductive pads 12. In one embodiment, an opening 15 is provided in the passivation layer 14, exposing underlying portion of the conductive pad 12. In at least one embodiment, the passivation layer 14 is formed of a non-organic material, such as un-doped silicate glass (USG), silicon nitride, silicon oxynitride, silicon oxide, or combinations thereof. The passivation layer 14 may be formed by any suitable method, such as chemical vapor deposition (CVD), physical vapor deposition (PVD), or the like. In other embodiments, the passivation layer 14 may be formed of a polymer layer, such as an epoxy, polyimide, benzocyclobutene (BCB), polybenzoxazole (PBO), or the like, although other relatively soft, often organic, dielectric materials can also be used. One of ordinary skill in the art will appreciate that a single pad layer and a single passivation layer are shown for illustrative purposes only. As such, other embodiments may include any number of conductive pads and/or passivation layers.

Figure 3:
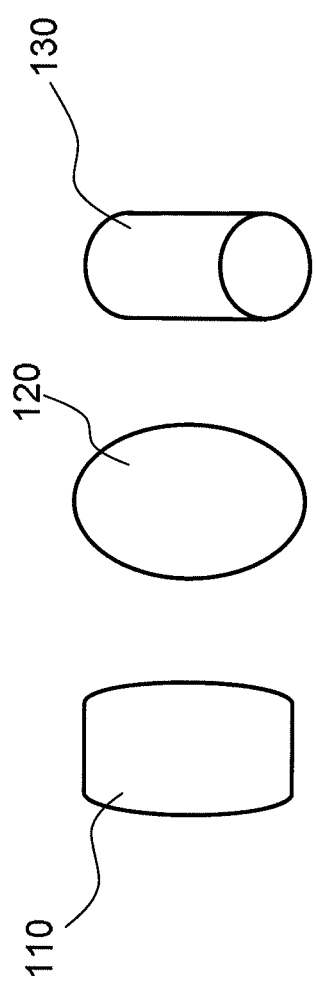
FIG. 3 are top views of three exemplary elongated structures of an under bump metallurgy (UBM) layer and/or a conductive pillar according to an embodiment.

FIG. 1 illustrates an under-bump-metallurgy (UBM) layer 16 and a conductive pillar 18 formed on the passivation layer 14 and electrically connected to the conductive pad 12 through the opening 15. In an embodiment, the top view of the UBM layer 16 and/or the conductive pillar 18 is an elongated shape. Various shapes may be used to implement the elongated structure, including, but not limited to, a rectangle, a rectangle with at least one curved or rounded side, a rectangle with two convex curved sides, an oval, an ellipse or any other elongated shape. Referring now to FIG. 3, illustrated are top views of three exemplary elongated structures of the UBM layer 16 and/or the conductive pillar 18. An elongated structure 110 shows a rectangular shape with two convex curved long-sides. An elongated structure 120 shows an ellipse-shaped bump structure. Similarly, an elongated structure 130 shows a rectangular shape with two convex curved short-sides.

In an embodiment, the UBM layer 16 is formed over the surfaces of the passivation layer 14 and the exposed portion of the conductive pad 12. In an embodiment, the UBM layer 16 includes a diffusion barrier layer or a glue layer, which may comprise titanium (Ti), tantalum (Ta), titanium nitride (TiN), tantalum nitride (TaN), or the like and be formed by PVD or sputtering. In an embodiment, the UBM layer 16 further includes a seed layer formed on the diffusion barrier layer by PVD or sputtering. The seed layer may be formed of copper (Cu) or copper alloys including Al, chromium (Cr), nickel (Ni), tin (Sn), gold (Ag), or combinations thereof. In some embodiments, the UBM layer 16 includes a Ti layer and a Cu seed layer.

In an embodiment, the conductive pillar 18 is formed on the UBM layer 16. In at least one embodiment, the conductive pillar 18 includes a Cu layer. The Cu layer comprises pure elemental copper, copper containing unavoidable impurities, and/or copper alloys containing minor amounts of elements such as Ta, indium (In), SN, zinc (Zn), manganese (Mn), chromium (Cr), titanium (Ti), germanium (Ge), strontium (Sr), platinum (Pt), magnesium (Mg), aluminum (Al) or zirconium (Zr). The conductive pillar 18 may be formed by sputtering, printing, electroplating, electro-less plating, electrochemical deposition (ECD), molecular beam epitaxy (MBE), atomic layer deposition (ALD), and/or commonly used CVD methods. In one embodiment, the Cu layer is formed by electro-chemical plating (ECP). In an exemplary embodiment, the thickness of the conductive pillar 18 is greater than 20 μm. In another exemplary embodiment, the thickness of the conductive pillar 18 is greater than 40 μm. For example, the conductive pillar 18 is about 20-50 μm thickness, or about 40-70 μm thickness, although the thickness may be greater or smaller. In at least one embodiment, the dimension and shape of the conductive pillar 18 are substantially the same as those of the UBM layer 16. In some embodiments, the dimension and shape of the conductive pillar 18 are not exactly the same as those of the UBM layer 16 because of differences induced by manufacturing process.

In an embodiment, a solder layer 20 is formed on the conductive pillar 18. The solder layer 20 can be made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, and other similarly appropriate material by plating methods. In at least one embodiment, the solder layer 20 is formed with a controlled volume. Applicant learned when the volume of the solder material is too great for a given area, bridges and cold joint issues can occur in some fine-pitch applications. In an embodiment, the solder layer 20 is formed of a controlled thickness T less than or equal to about 16 μm. In another embodiment, the thickness T is less than or equal to about 12 μm. In at least another embodiment, the thickness T of the solder layer 20 is controlled at a range between about 5 μm and about 16 μm.

In an embodiment, a solder reflow process is performed at a temperature equal to or higher than the solder melting temperature. After the solder reflow process, the solder layer 20 is melted and turned into a reflowed solder layer 20. The thickness and surface shape can be changed after the reflow process. For example, the reflowed solder layer 20 has a spherical surface as shown in FIG. 2. In an embodiment, the greatest height H of the reflowed solder layer 20 is greater than or equal to the thickness T. For one example, the greatest height H is less than or equal to about 16 μm. For another example, the greatest height H is less than or equal to about 12 μm. For some examples, the greatest height H is less than or equal to about 21 μm In an embodiment, a bump structure 22 comprising the UBM layer 16, the conductive pillar 18 and the reflowed solder layer 20 is completed on the chip 100. Then the chip 100 will be attached to a workpiece, such as a dielectric substrate, a package substrate, a printed circuit board (PCB), an interposer, a wafer, another chip using wafer-level or chip-level stacking, a package unit, and the like. For example, embodiments may be used in chip-to-substrate bonding configuration, a chip-to-chip bonding configuration, a chip-to-wafer bonding configuration, a wafer-to-wafer bonding configuration, chip-level packaging, wafer-level packaging, or the like. The bump structure 22 may subsequently be connected to a conductive trace on the workpiece, thus a bump-on-trace (BOT) interconnect structure is formed in a semiconductor package.

Figure 4:
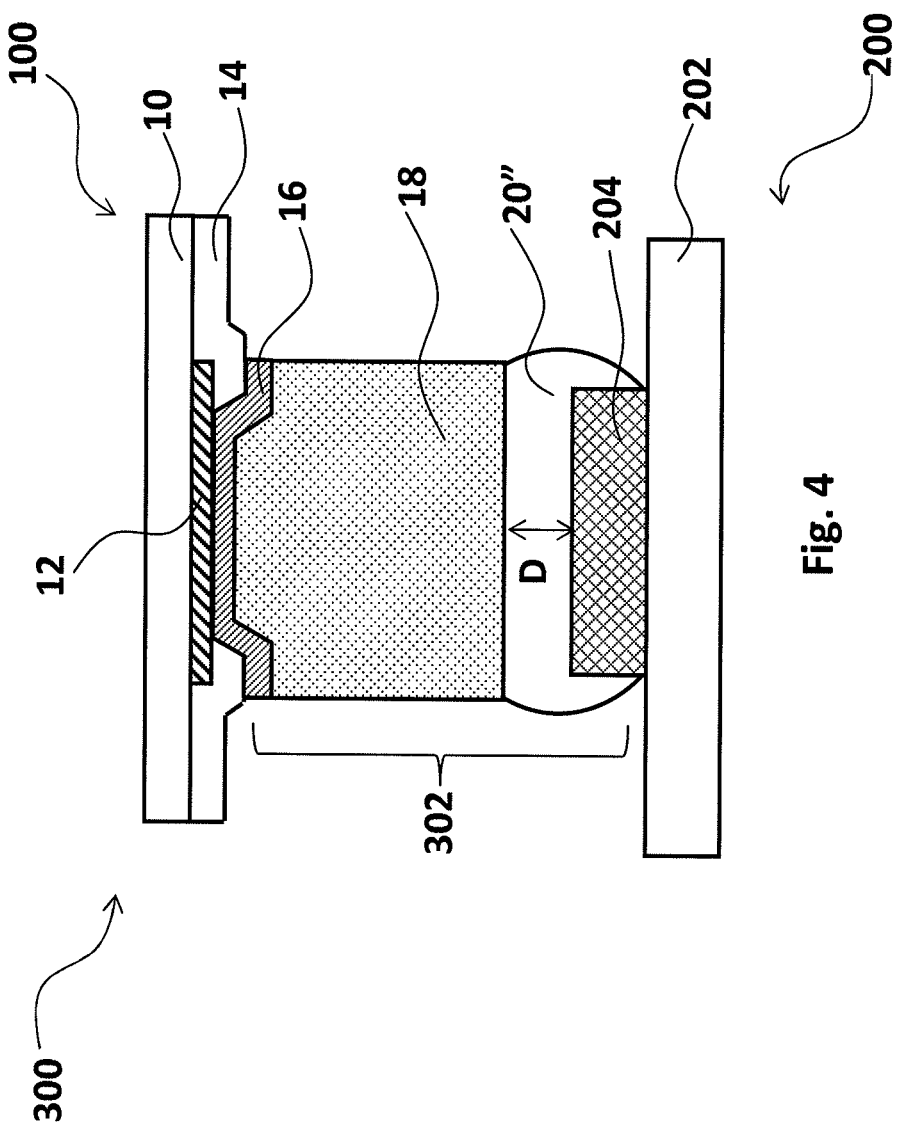
FIG. 4 is a cross-sectional view of a semiconductor package comprising a chip coupled to a substrate in accordance with an embodiment.

FIG. 4 is a cross-sectional view of a semiconductor package comprising a chip coupled to a workpiece in accordance with an embodiment.

In an embodiment, a workpiece 200 includes a substrate 202, which may be a package substrate, a PCB, a wafer, a chip, an interposer, a dielectric substrate, a package unit or other suitable substrate. The substrate 202 includes a plurality of conductive traces 204 electrically connected to underlying metal interconnection. The conductive traces 204 may be formed of substantially pure Cu, AlCu, or other metallic materials such as W, Ni, Pd, Au, and alloys thereof. Some areas of the conductive traces 204 are defined as landing regions for electrically connecting to the bump structures 20. In some embodiments, a pre-solder layer is provided on the conductive trace 204. A solder mask layer can be provided to define the landing regions of the conductive trace 204. The solder mask layer can be a solder mask defined (SMD) type or a non-solder mask define (NSMD) type. A solder mask layer is not shown in FIG. 4 for clarity.

In an embodiment, the chip 100 with the bump structure 22 is flipped upside down and attached to the workpiece 200 through flip-chip bonding technologies so as to form a semiconductor package 300 as shown in FIG. 4. An exemplary coupling process includes at least one of a flux application, chip placement, reflowing of melting solder joints, and/or cleaning of flux residue. A high temperature process, such as reflow or thermal compression bonding, can be performed to melt the solder layer 20 on the conductive pillar 18. The melted solder material thus joins the chip 100 and the workpiece 200 together and electrically connects the bump structure 22 to the conductive trace 204. A solder joint region 20" formed by melting the solder material is formed between the conductive pillar 18 and the conductive trace 204. The bump structure 22 electrically connected to the conductive trace 204 through the solder joint region 20" and thus forms a bump-on-trace (BOT) interconnect structure 302 in the semiconductor package 300. After the solder jointing, an underfill (not shown) may be filled into the space between chip 100 and workpiece 200, and thus the underfill is also filled into the space between neighboring conductive traces. Alternatively, no underfill is provided in the semiconductor package 300.

Figure 5:
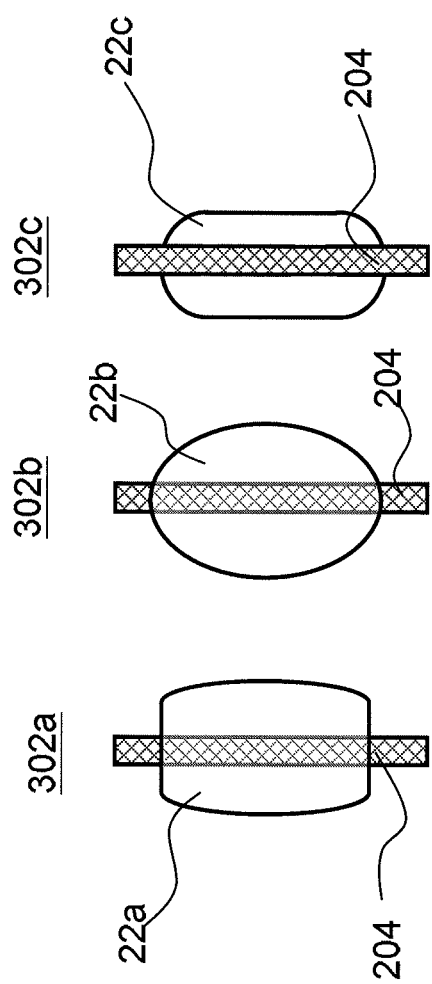
FIG. 5 are top views of three exemplary elongated bump-on-trace interconnect structures according to an embodiment.

Referring now to FIG. 5, illustrated are top views of three exemplary BOT interconnect structures. Structure 302a comprises an elongated bump structure 22a formed on the conductive trace 204, the bump shaped as a rectangular with two convex curved long-sides. Structure 302b comprises an ellipse-shaped bump structure 22b formed over trace 204. Similarly, structure 302c comprises an elongated shaped bump 22c formed over the conductive trace 204, the bump shaped as a rectangular with two convex curved short-sides. In some embodiments, the elongated axis of the elongated bump structure runs coaxial, i.e., parallel or nearly parallel to the axis of the conductive trace 204.

In an embodiment, since the solder volume is controlled during the bump formation, the volume of the solder joint region 20 can be well controlled to overcome bridge and cold joint issues, solving the yield loss problem. In the BOT interconnect structure 302, a distance D measured from the top surface of the conductive pillar 18 to the top surface of the conductive trace 204 may be substantially equal to the thickness T of the solder layer 20. In an embodiment, the distance D is less than or equal to about 16 μm. In another embodiment, the distance D is less than or equal to about 12 μm. In the other embodiment, the distance D is at a range between about 5 μm and about 16 μm. From experimental results it is observed that when the thickness T is controlled at a value equal to or less than about 16 the distance D can be controlled at a value equal to or less than about 16 μm and no bridge issue is detected as an electrical short in the measurement. The same results can be found when the thickness T and the distance D controlled at a value equal to or less than about 12 μm.

Figure 6:
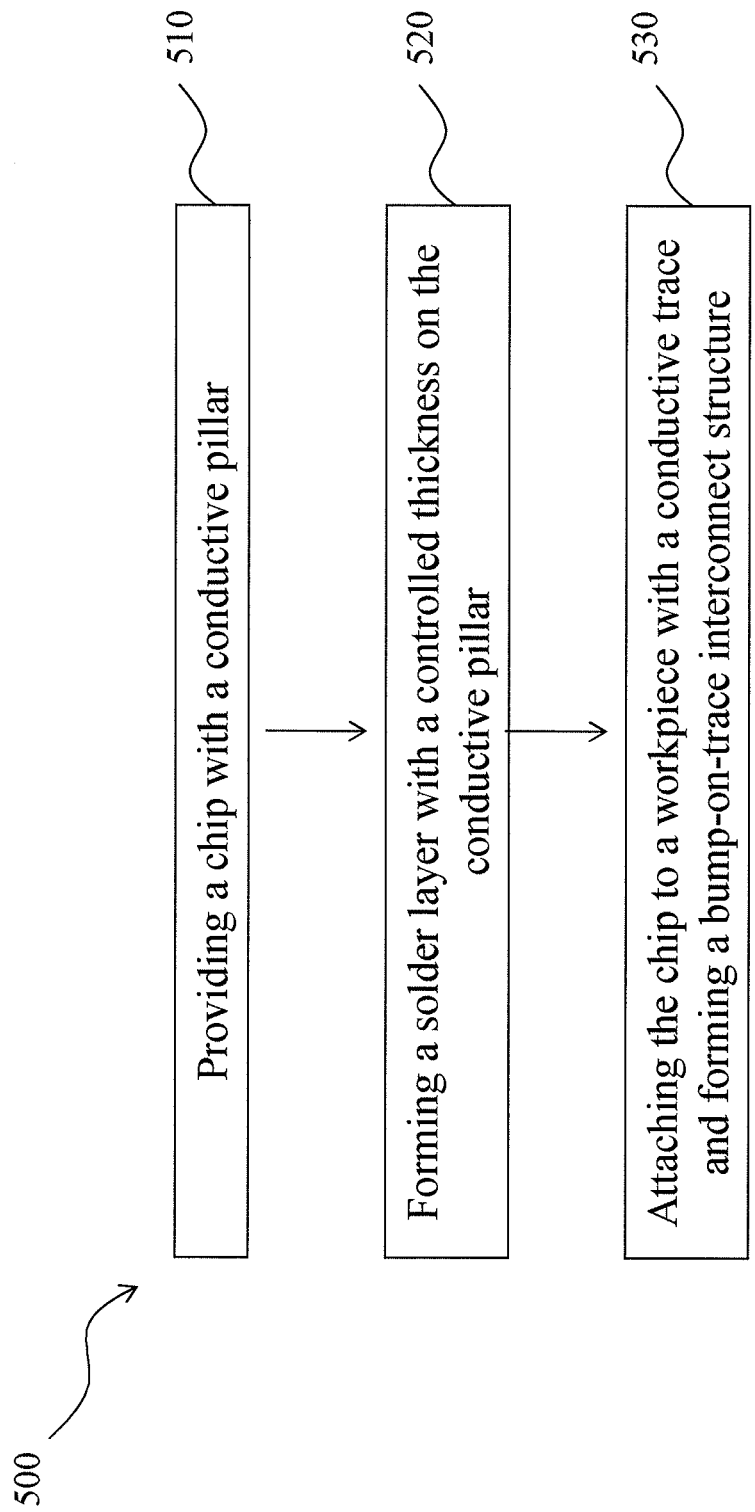
FIG. 6 is a flow chart of a method for forming a semiconductor package according to an embodiment.

FIG. 6 is a flow chart of the method for fabricating a semiconductor package according to an embodiment. The method 500 begins with step 510 in which a chip with a conductive pillar is provided. In an embodiment, the conductive pillar comprises copper or copper alloys. In an embodiment, the conductive pillar is an elongated shape. The method 500 continues with step 520 in which a solder layer with a controlled thickness T is formed on the conductive pillar. In an embodiment, the thickness T is less than or equal to about 16 μm. In an embodiment, the thickness T is less than or equal to about 12 μm. In an embodiment, the thickness T is at a range between about 5 μm and about 16 μm. The method 500 continues with step 530 in which the chip is attached to a workpiece with a conductive trace and the conductive pillar is electrically connected to the conductive trace through the solder layer. A bump-on-trace (BOT) interconnect structure is therefore formed in a semiconductor package. In an embodiment, the workpiece is a dielectric substrate and the conductive trace includes copper or copper alloys. In at least one embodiment, a distance between the conductive pillar and the conductive trace is less than or equal to about 16 μm.

In accordance with an embodiment, a semiconductor package includes a workpiece with a conductive trace and a chip with a conductive pillar. The chip is attached to the workpiece through a solder joint region formed between the conductive pillar and the conductive trace. A distance between the conductive pillar and the conductive trace is less than or equal to 16 μm.

In accordance an embodiment, a semiconductor package includes a substrate with a conductive trace, and a chip with a bump structure. The bump structure includes a conductive pillar and a solder layer formed on the conductive pillar. The chip is electrically coupled to the substrate, and the bump structure is electrically connected to the conductive trace to form a bump-on-trace (BOT) interconnect structure. In the BOT interconnect structure, a distance between the conductive pillar and the conductive trace is less than or equal to about 16 μm.

In accordance with another aspect of the disclosure, a method includes providing a semiconductor substrate with an elongated conductive pillar, and forming a solder layer on the elongated conductive pillar. The solder layer has a thickness less than or equal to about 16 μm.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor package, comprising:
    a workpiece comprising a conductive trace; and
    a chip comprising an under-bump-metallurgy (UBM) layer having an elongated cross-sectional shape and a conductive pillar having a cross-sectional shape substantially the same as the UBM layer cross-sectional shape,
    wherein the chip is attached to the workpiece through a solder joint region between the conductive pillar and the conductive trace;
    wherein a distance between the conductive pillar and the conductive trace ranges from 5 micrometers (μm) to 15 μm, and the conductive trace extends outside the solder joint region along an axis parallel to a top surface of the workpiece.

2. The semiconductor package of claim 1, wherein the distance between the conductive pillar and the conductive trace is less than or equal to 12 µm.

3. The semiconductor package of claim 1, wherein the conductive pillar comprises copper.

4. The semiconductor package of claim 1, wherein the workpiece comprises a dielectric substrate.

5. The semiconductor package of claim 1, wherein the conductive trace comprises copper.

6. A semiconductor package, comprising:
a substrate comprising a conductive trace; and
a chip comprising a bump structure, wherein the bump structure comprises an under-bump-metallurgy (UBM) layer having an elongated cross-sectional shape, a conductive pillar having a cross-sectional shape substantially the same as the UBM layer cross-sectional shape, and a solder layer on the conductive pillar;
wherein the chip is electrically coupled to the substrate, and the bump structure is electrically connected to the conductive trace to form a bump-on-trace (BOT) interconnect structure;
wherein the conductive trace extends beyond the conductive pillar on at least two sides of the conductive pillar, and
wherein, in the BOT interconnect structure, a distance between the conductive pillar and the conductive trace ranges from 5 micrometers (µm) to 15 µm.

7. The semiconductor package of claim 6, wherein the cross-sectional shape is a rectangular shape with a curved side.

8. The semiconductor package of claim 6, wherein the conductive pillar comprises copper.

9. The semiconductor package of claim 6, wherein the substrate is a dielectric substrate.

10. The semiconductor package of claim 6, wherein the conductive trace comprises copper.

11. The semiconductor package of claim 6, wherein the distance is less than or equal to 12 µm.

12. A method, comprising:
providing a semiconductor substrate comprising an elongated conductive pillar;
forming a solder layer on the elongated conductive pillar;
providing a dielectric substrate comprising an elongated conductive trace; and
attaching the semiconductor substrate to the dielectric substrate, wherein the solder layer is positioned between the elongated conductive pillar and the elongated conductive trace,
wherein a distance between the elongated conductive pillar and the elongated conductive trace ranges from 5 micrometers (µm) to 15 µm, and
the conductive trace extends outside the solder layer along an axis parallel to a top surface of the dielectric substrate.

13. The method of claim 12, wherein the elongated conductive pillar is a rectangular shape having at least one curved side.

14. The method of claim 12, wherein a distance between the conductive pillar and the conductive trace is less than or equal to 12 µm.

15. The method of claim 12, wherein the conductive trace comprises copper.

16. The method of claim 12, wherein the conductive pillar comprises copper.

17. The semiconductor package of claim 1, wherein the conductive trace extends beyond the conductive pillar on at least two sides of the conductive pillar.

18. The semiconductor package of claim 6, wherein the conductive trace extends outside the BOT interconnect structure along an axis parallel to a top surface of the substrate.

19. The method of claim 12, wherein attaching the semiconductor substrate to the dielectric substrate comprises attaching the semiconductor substrate so that the conductive trace extends beyond the conductive pillar on at least two sides of the conductive pillar.

20. The semiconductor package of claim 6, wherein the cross-sectional shape is an elliptical shape.

* * * * *